(12) United States Patent
Takikawa (10) Patent No.: US 7,728,346 B2
(45) Date of Patent: Jun. 1, 2010

(54) LIGHT ILLUMINATION DEVICE

(75) Inventor: Hiroshi Takikawa, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 614 days.

(21) Appl. No.: 11/554,101

(22) Filed: Oct. 30, 2006

(65) Prior Publication Data

US 2007/0103899 A1    May 10, 2007

(51) Int. Cl.
*H01L 51/52* (2006.01)
(52) U.S. Cl. .................... 257/99; 257/95; 257/E33.058
(58) Field of Classification Search .................... 257/88, 257/98, 735, 692, 698, 601, 89, 99, 95, E33.058
See application file for complete search history.

(56) References Cited

U.S. PATENT DOCUMENTS

| 4,839,686 A | 6/1989 | Hosomizu et al. |
| 4,951,081 A | 8/1990 | Hosomizu et al. |
| 2004/0203312 A1* | 10/2004 | Bortscheller et al. ........... 445/24 |
| 2005/0233485 A1* | 10/2005 | Shishov et al. ................. 438/25 |
| 2007/0080438 A1* | 4/2007 | Yamanaka et al. ........... 257/676 |
| 2008/0266893 A1* | 10/2008 | Speier ......................... 362/551 |

FOREIGN PATENT DOCUMENTS

| JP | U S58-158458 A | 10/1983 |
| JP | H05-002942 | 1/1993 |

* cited by examiner

*Primary Examiner*—Jerome Jackson, Jr.
*Assistant Examiner*—Dale Page
(74) *Attorney, Agent, or Firm*—Cermak Kenealy Vaidya & Nakajima LLP

(57) ABSTRACT

An LED illumination device can include a bridge connection circuit that includes five LED chips. The LED chips can be installed such that four LED chips, through which half-wave rectified current flows, are disposed in a generally cross-shaped opposed arrangement with the remaining LED chip interposed therebetween. The remaining LED chip can also have a full-wave rectified current flowing therethrough. Half-wave rectified currents having phases shifted by 180° (half the period) can flow through respective LED chips installed at a generally right angle. The placement range for the five LED chips can be limited, and the LED chips can be sealed with a wavelength conversion material.

4 Claims, 6 Drawing Sheets

LIGHT ILLUMINATION DEVICE

This application claims the priority benefit under 35 U.S.C. §119 of Japanese Patent Application No. 2005-314764 filed on Oct. 28, 2005, which is hereby incorporated in its entirety by reference.

TECHNICAL FIELD

The disclosed subject matter relates to an LED illumination device, and in particular to an LED illumination device which is driven directly by a commercial power supply.

RELATED ART

Examples of conventional methods for driving an LED illumination device include: (1) a method in which the device is driven by directly applying a DC voltage from a DC power supply such as a dry cell or a battery; (2) a method in which the device is driven by applying a DC voltage obtained by converting an AC voltage from an AC power supply, such as a commercial power supply, through the use of a constant voltage power supply; and (3) a method in which the device is driven by applying an AC voltage as is from an AC power supply, such as a commercial power supply, without conversion through a constant voltage power supply.

Figure 1:
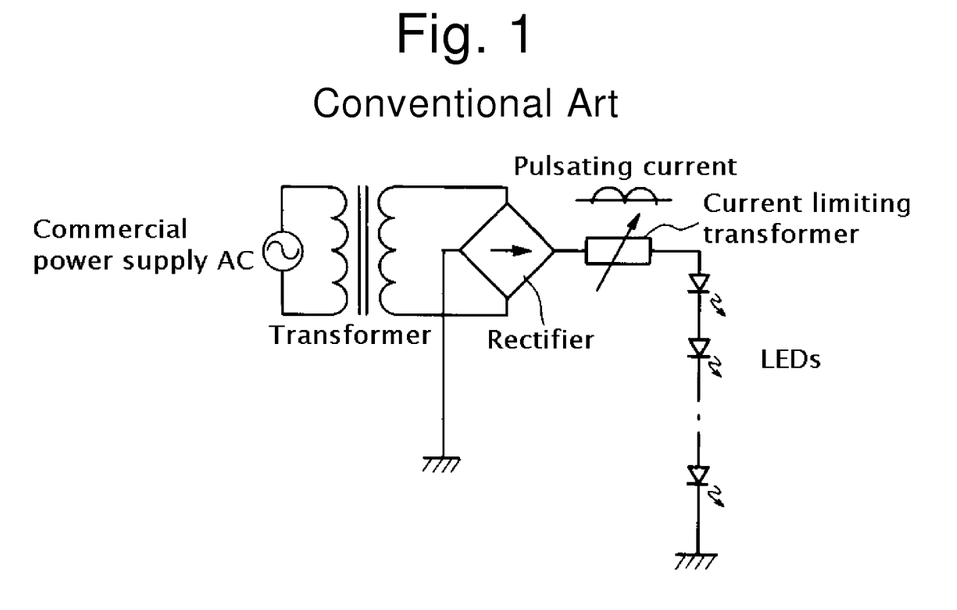
FIG. 1 is a circuit diagram of a conventional LED illumination device.
Figure 2:
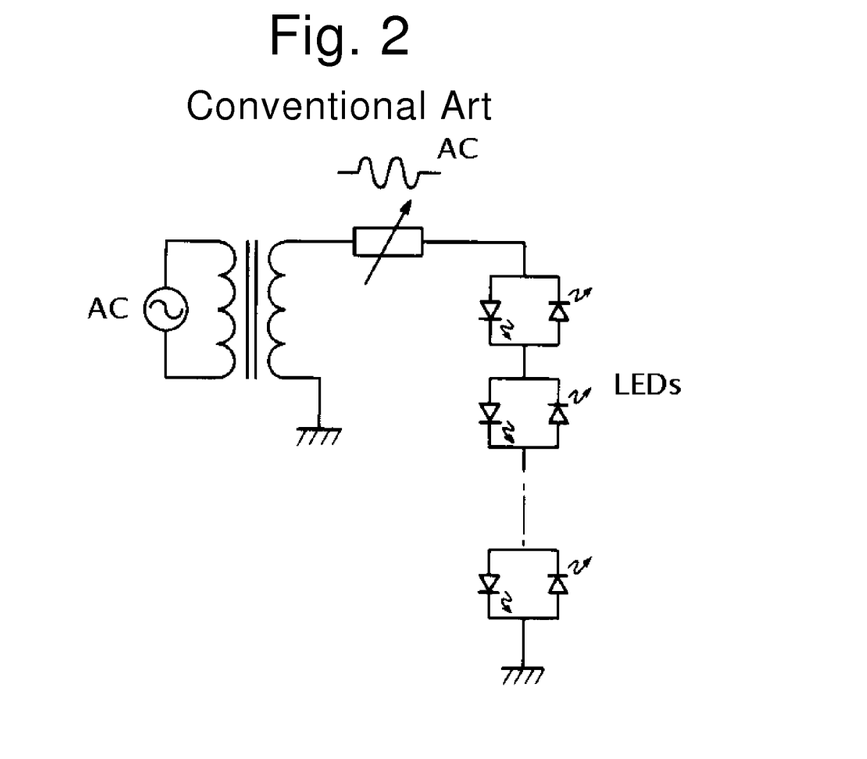
FIG. 2 is a circuit diagram of another conventional LED illumination device.
Figure 3:
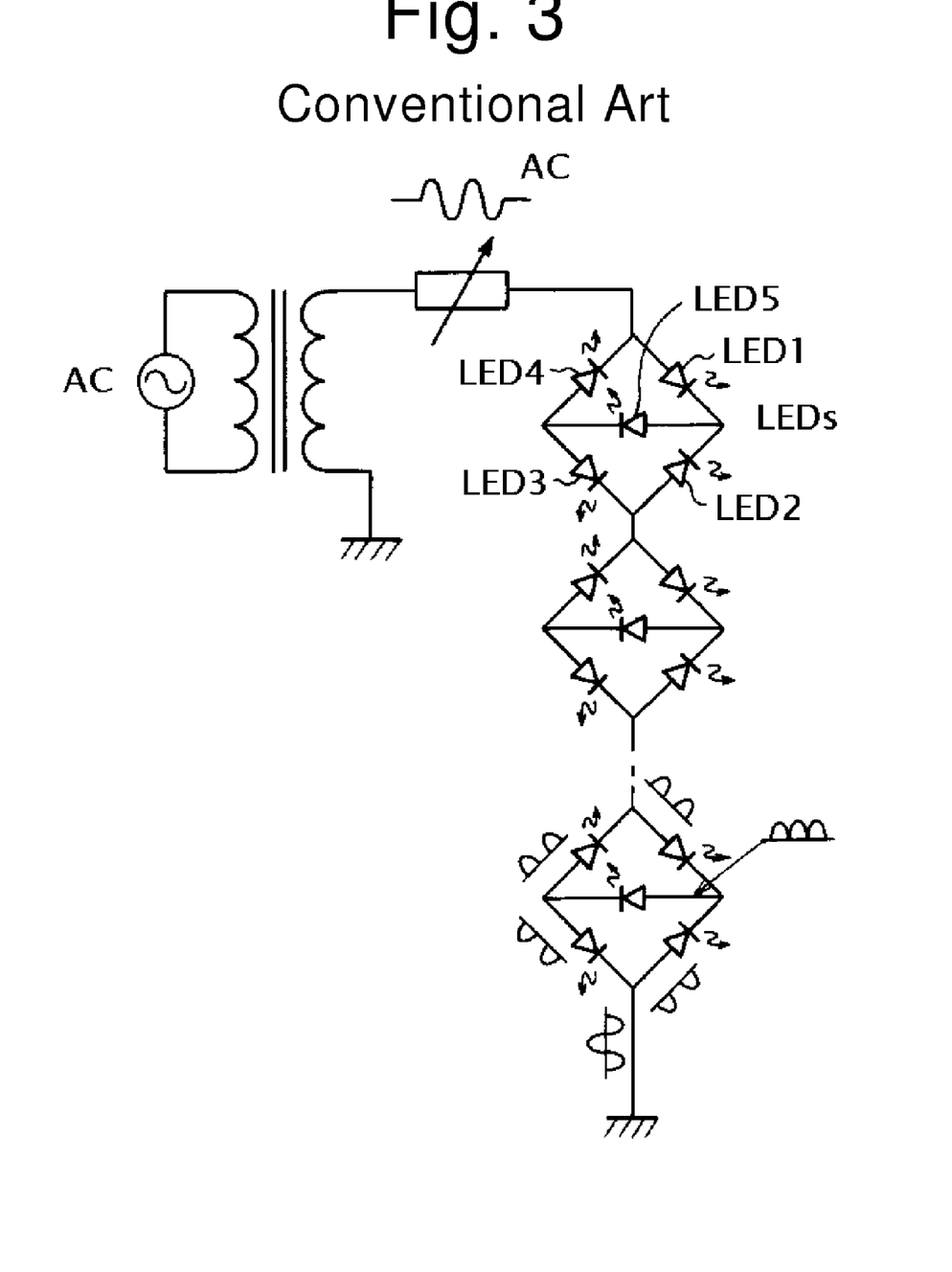
FIG. 3 is a circuit diagram of yet another conventional LED illumination device.

When an LED illumination device is driven by an AC voltage without conversion through a constant voltage power supply as in example (3), circuit configurations shown in FIGS. 1 to 3 are generally employed.

In the circuit configuration shown in the circuit diagram of FIG. 1, a plurality of LEDs is connected in series, and a current limiting resistor is connected thereto. An AC input voltage from a commercial power supply is stepped down by a transformer to an appropriate voltage, and subsequently the stepped down voltage is full-wave rectified through a rectifier to obtain a pulsating current. This pulsating current is applied between one end of the plurality of LEDs and one end of the current limiting resistor to thereby drive the LEDs.

In the circuit configuration shown in the circuit diagram of FIG. 2, two LEDs are connected in antiparallel to form a non-polarized LED group. A plurality of such LED groups is connected in series, and a current limiting resistor is connected thereto. An AC input voltage from a commercial power supply is stepped down by a transformer to an appropriate voltage, and this stepped down AC voltage is applied between one end of the plurality of the LED groups and one end of the current limiting resistor to thereby drive the LEDs.

In the circuit configuration shown in the circuit diagram of FIG. 3, LEDs are connected in a bridge configuration to form a non-polarized LED group. A plurality of such LED groups is connected in series, and a current limiting resistor is connected thereto. An AC input voltage from a commercial power supply is stepped down by a transformer to an appropriate voltage, and the stepped down voltage is applied between one end of the plurality of the LED groups and one end of the current limiting resistor to thereby drive the LEDs (see, for example, Japanese Utility Model Laid-Open Publication No. Sho 58-158458, Japanese Patent Laid-Open Publication No. Hei 05-2942 and their associated English Abstracts), the disclosures of which are incorporated herein by reference.

The circuit configurations of FIGS. 2 and 3 above are based on basically the same concept. In the circuit configuration of FIG. 2, a reverse voltage applied to one of the LEDs connected in antiparallel and forming the LED group is clamped by a forward voltage of the other LED. In this manner, the destruction of the LEDs due to a reverse voltage is prevented, and therefore a rectifier is not required to be provided in the electric circuit.

Furthermore, in the circuit configuration of FIG. 2, all the LEDs are driven by a half-wave rectified voltage. On the other hand, in the circuit configuration of FIG. 3, an LED 5 serving as a load in the central portion of the bridge connection circuit is driven by a full-wave rectified voltage, and the remaining four LEDs (LED 1-LED 4) are driven by a half-wave rectified voltage. Furthermore, a voltage corresponding to about twice the forward voltage to be applied to a single LED is applied as a reverse voltage to each of the LEDs 1 to 4.

Specifically, an LED illumination device having the circuit configuration of FIG. 3 is employed as an emergency alarm lamp such as a disaster lamp in which all the LEDs are constituted by a plurality of red LEDs.

When producing an LED illumination device that uses the circuit configuration of FIG. 1, the number of parts is relatively high because a rectifier for full-wave rectification is provided in the illumination device. Therefore, the device becomes large, and the manufacturing cost increases.

Furthermore, when producing an LED illumination device that uses the circuit configuration of FIG. 2 or 3, a rectifier is not required to be provided. However, in LEDs driven by a half-wave rectified voltage from a commercial power supply, the frequency of illumination ripple may be low. Therefore, a flicker effect can be recognized by normal human eyes, and thus a problem exists in that the LED illumination device lacks illumination quality and therefore lacks marketability.

One reason for the above noted flicker effect can be explained as follows. In typical visual performance characteristics for human eyes, a critical flicker frequency is known to be about 20 Hz. Here, the critical flicker frequency is a critical frequency at which flicker is not recognized when pulse-like light emitted at a constant frequency is observed. In the light emitted from an LED driven by a half-wave rectified voltage of a commercial frequency (50 Hz in eastern Japan, 60 Hz in western Japan, and 60 Hz in the U.S.), intensity changes can still be followed visually. Furthermore, the critical flicker frequency is said to be roughly proportional to the logarithm of the average luminance. Therefore, the critical flicker frequency tends to be high for LEDs serving as a high luminance point light source. Hence, in an LED illumination device in which a plurality of LEDs are installed two-dimensionally, time conditions for realizing the reduction of the flicker effect are reduced, and thus variations in plane luminance distribution may be easily recognized.

SUMMARY

Accordingly, the presently disclosed subject matter has been devised in view of the foregoing and other problems and considerations. One of them many purposes of the presently disclosed subject matter is to provide an LED illumination device that includes a plurality of LEDs and is driven by directly applying a voltage from a commercial power source. In the LED illumination device, flicker effect and recognizable variations in plane luminance distribution can be reduced without providing rectification means inside the device. In addition, the device is excellent in illumination quality and is therefore should be easily marketable.

In order to solve the foregoing and other problems, one aspect of the presently disclosed subject matter includes providing an LED illumination device that includes a bridge connection circuit and having: a first LED chip group composed of at least two LED chips having respective cathodes connected to each other; a second LED chip group composed of at least two LED chips having respective anodes connected to each other; a third LED chip having an anode connected to a cathode side of the first LED chip group and having a cathode connected to an anode side of the second LED chip group; and a pair of contacts to which respective anodes of the first LED chip group and respective cathodes of the second LED chip group are connected. The LED illumination device can include an area of an active layer of the third LED chip that is larger than that of each of the LED chips constituting the first and second LED chip groups by substantially 1.5 to substantially 3 times, and possibly substantially 2.0 to substantially 2.5 times.

According to another aspect of the presently disclosed subject matter, an LED illumination device, comprising a bridge connection circuit, can include: a first LED chip group composed of at least two LED chips having respective cathodes connected to each other; a second LED chip group composed of at least two LED chips having respective anodes connected to each other; a third LED chip having an anode connected to a cathode side of the first LED chip group and having a cathode connected to an anode side of the second LED chip group; and, a pair of contacts to which respective anodes of the first LED chip group and respective cathodes of the second LED chip group are connected. The third LED chip of the LED illumination device can have a rated current value that is substantially two times a rated current value of each of the LED chips constituting the first and second LED chip groups.

In the LED illumination device as described above, the at least two LED chips that constitute the first LED chip group and the at least two LED chips that constitute the second LED chip group may be installed in a generally cross-shaped opposed arrangement with the third LED chip interposed therebetween.

At least one type of a fluorescent material (or other wavelength conversion material) may be applied so as to cover the third LED chip and each of the LED chips constituting the first and second LED chip groups.

The LED chips constituting the first and second LED chip groups may be installed such that a side edge of each of the LED chips that constitute the first and second LED chip groups is opposed to a corresponding side surface of the third LED chip.

A height of a placement surface for the third LED chip may be different from a height of a placement surface of each of the LED chips that constitute the first and second LED chip groups.

The third LED chip and the LED chips that constitute the first and second LED chip groups may be installed within a circular range having a diameter of approximately 8 mm.

The LED illumination device can be driven by applying a voltage from a commercial power supply. In this LED illumination device, five LED chips can be non-polarized by means of a bridge connection circuit configuration. Furthermore, these LED chips can be disposed in a cross-like shape such that LED chips through which half-wave rectified currents of the same phase flow are opposed to each other with an LED through which a full-wave rectified current flows sandwiched therebetween. Half-wave rectified currents having phases shifted by 180° (half the period) flow through respective LED chips installed at a generally right angle. Moreover, the placement range for the five LED chips can be limited, and the LED chips can be sealed with a fluorescent (or other wavelength conversion) material.

Hence, an LED illumination device can be realized which can be driven directly by a commercial power supply although the device does not have rectification means therein side. Furthermore, the LED illumination device has excellent illumination quality which is obtained by reducing the light flicker effect that is typically due to a commercial frequency and recognizable variations in plane luminance distribution when the device is on.

BRIEF DESCRIPTION OF THE DRAWINGS

These and other characteristics, features, and advantages of the disclosed subject matter will become clear from the following description with reference to the accompanying drawings, wherein.

DETAILED DESCRIPTION OF EXEMPLARY EMBODIMENTS

In an LED illumination device driven directly by a commercial power supply, an improvement in illumination quality and possibly marketability can possibly be realized by reducing a flicker effect by optimizing the circuit configuration and installation method of LED chips.

Hereinafter, exemplary embodiments of the presently disclosed subject matter will be described in detail with reference to FIGS. 4 to 10. The same or similar parts are designated by the same numerals. The embodiments described hereinafter are examples of the presently disclosed subject matter, and thus include various technical features and characteristics. However, the scope of the disclosed subject matter is not limited to the described embodiments.

Figure 4:
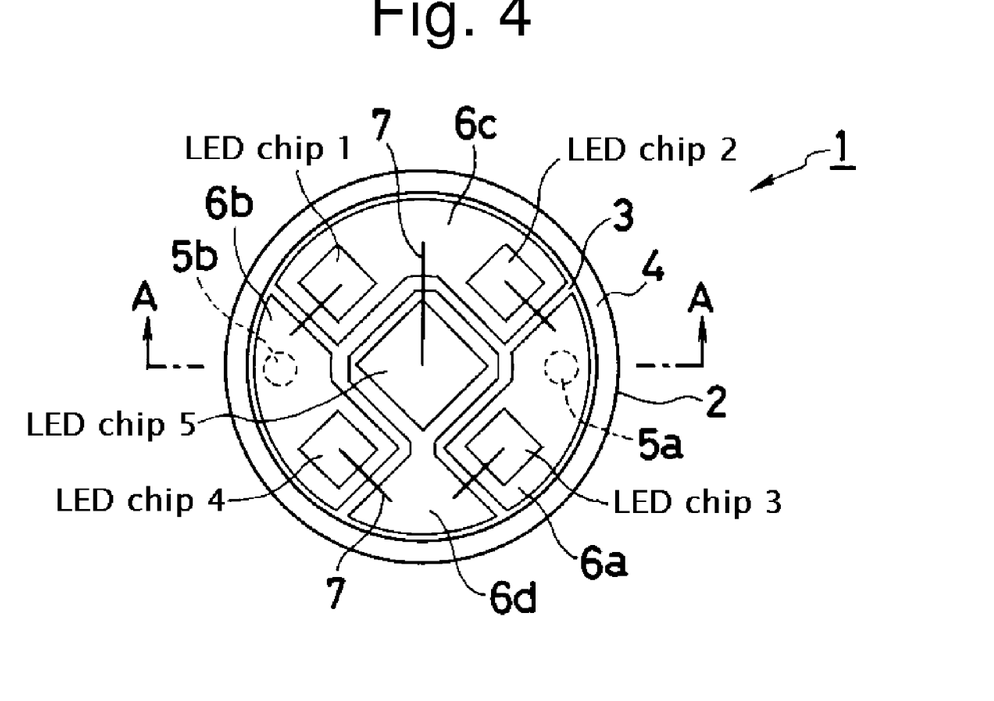
FIG. 4 is a plan view of one example of an LED illumination device made in accordance with principles of the disclosed subject matter.
Figure 5:
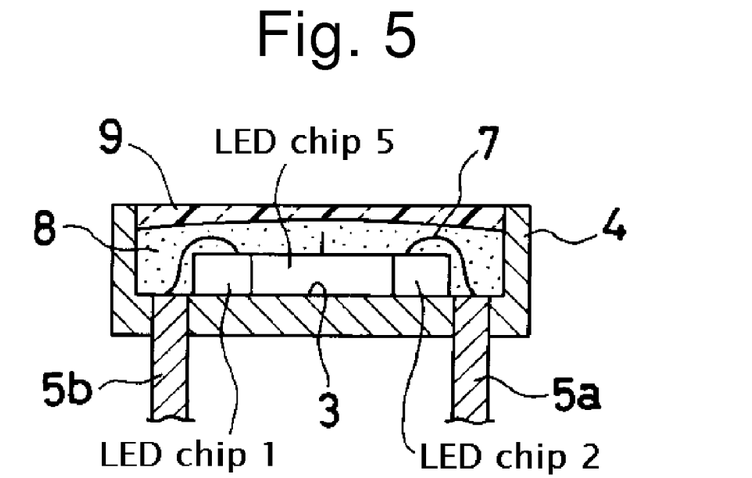
FIG. 5 is a cross-sectional view taken along line A-A in FIG. 4.
Figure 6:
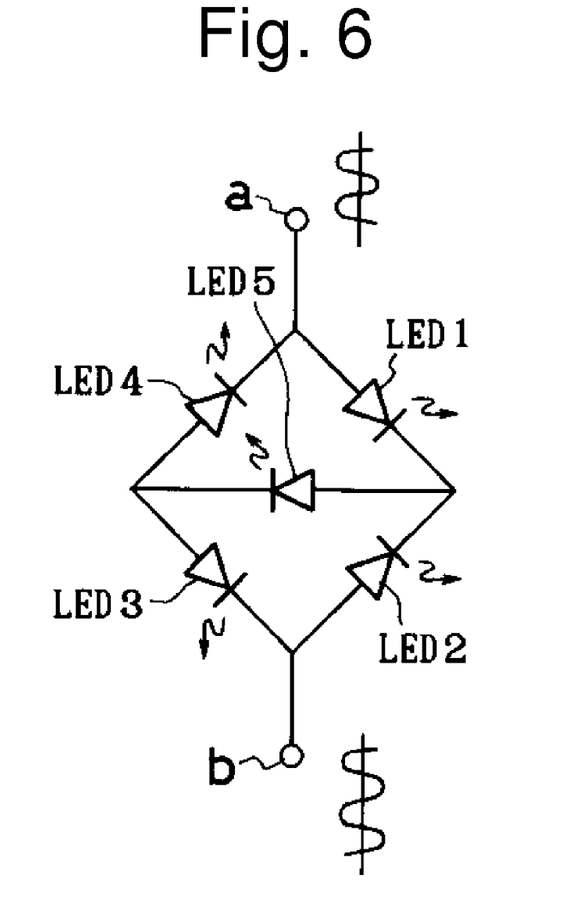
FIG. 6 is a circuit diagram of the example of the LED illumination device of FIG. 4.
Figure 7:
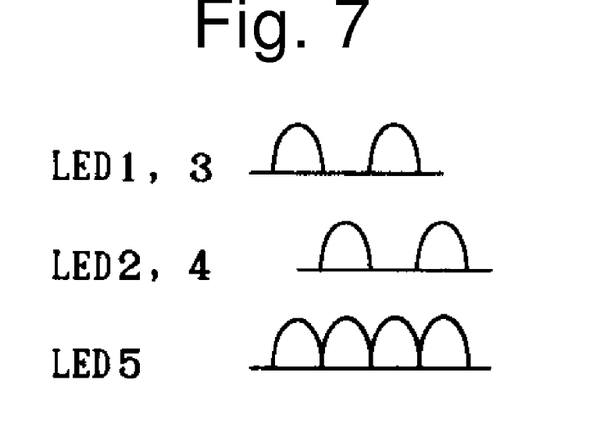
FIG. 7 is a current waveform diagram of the example of the LED illumination device of FIG. 4.

FIG. 4 is a plan view of one example of an LED illumination device made in accordance with principles of the disclosed subject matter, and FIG. 5 is a cross-sectional view taken along line A-A of FIG. 4. Furthermore, FIG. 6 is a circuit diagram, and FIG. 7 is a current waveform diagram.

The LED illumination device 1 of the exemplary embodiment of FIG. 4 can have a light source unit constituted by five LED chips, i.e., LED chips 1 to 5. Each of the LED chips can include an anode electrode formed on the upper side thereof and a cathode electrode formed on the lower side thereof. A package 2 on which the LED chips are mounted can include a metal stem, a ceramic carrier, or other carrying structure. The package 2 can be configured to have a generally circular inner bottom surface 3 and a side wall 4 extending from the edge portion of the inner bottom surface 3, the side wall 4 being generally perpendicular with respect to the inner bottom surface 3. Leads 5a and 5b can extend out from the inner bottom surface 3 of the package 2 and be provided below the package 2.

Four conductor patterns 6a, 6b, 6c, and 6d can be separated from each other and formed on the inner bottom surface of the package 2. The conductor patterns 6a and 6b are shown connected to the leads 5a and 5b, respectively, to provide electrical continuity.

In the central portion of the inner bottom surface 3, the LED chip 5 is shown installed on the conductor pattern 6d. The LED chips 1 and 3 can be installed on the conductor patterns 6c and 6a, respectively, so as to be opposed to each other with the LED chip 5 interposed therebetween. Similarly, the LED chips 2 and 4 can be installed on the conductor patterns 6c and 6b, respectively, so as to be aligned in a direction generally orthogonal to a line connecting the LED chips 1 and 3 and opposed to each other with the LED chip 5 interposed therebetween. In this manner, the lower electrode of each of the LED chips can be brought into electrical conduction with the conductor pattern on which the each of the LED chips is installed.

The upper electrode of the LED chip 1 can be connected to the conductor pattern 6b through a bonding wire 7, and the upper electrode of the LED chip 2 can be connected to the conductor pattern 6a through another bonding wire 7. Likewise, the upper electrodes of the LED chips 3 and 4 can be connected to the conductor pattern 6d through bonding wires 7. The upper electrode of the LED chip 5 can be connected to the conductor pattern 6c through yet another bonding wire 7. In this manner, the upper electrode of each of the LED chips can be brought into electrical conduction with the corresponding one of the conductor patterns connected through the bonding wire.

Furthermore, the LED chips 1 to 5 can be arranged such that a side surface of each of the LED chips 1 to 4 is opposed to a corresponding side surface of the LED chip 5 so as to be generally parallel to each other.

In this case, all the LED chips 1 to 4 have approximately the same height and approximately the same area of a principal light emission surface (corresponding to the area of an active layer). However, it is possible for the LED chip 5 to have approximately the same height as each of those of the LED chips 1 to 4 and an area of a principal light emission surface that is substantially 1.5 to 3 times larger than the area of each of the LED chips 1 to 4, although the presently disclosed subject matter is not limited thereto.

The LED chip 5 can include a device structure that is different from those of the other LED chips, i.e., the thickness of a current spreading layer, a layer resistance, pattern texturing, a thermal diffusion structure, and the like can be different. Therefore, the area of the principal light emission surface and the height of the LED chip 5 are selected based on parameters such as junction temperature and differential efficiency of light emission. If the device structure of the LED chip 5 is the same as those of the LED chips 1 to 4, the area of the principal light emission surface thereof can effectively be about 2.0 to about 2.5 times larger than the area of each of the LED chips 1 to 4.

Furthermore, at least one type of a wavelength conversion material 8 (e.g. fluorescent material) can be applied so as to cover the LED chips 1 to 5 and the bonding wires. A translucent resin 9 can then be filled thereover.

Examples of a wavelength conversion materials include materials which can be applied to an LED chip and that are to be excited by the light emitted from the LED chip and that are capable of converting the wavelength of the light, whereby emitting light having a color different from the light emitted from the LED chip. For example, when the light emitted from an LED chip is blue light, a fluorescent material may be employed which is excited with the blue light to form yellow light through wavelength conversion. Here, yellow is a complementary color of blue. In this case, white light can be produced through additive color mixture of the blue light emitted from the LED chip and yellow light obtained by exciting the fluorescent material with a part of the blue light emitted from the LED chip to convert the wavelength of the blue light.

Similarly, when the light emitted from an LED chip is blue light, a mixture of two types of fluorescent materials may by employed. These two types of the fluorescent materials are excited with the blue light to emit green light and red light, respectively, through wavelength conversion. Also in this case, white light can be produced through additive color mixture of the blue light emitted from the LED chip with green light and red light which are formed by exciting the fluorescent materials with a part of the blue light emitted from the LED chip to convert the wavelength of the blue light.

Furthermore, when the light emitted from an LED chip is ultraviolet light, a mixture of three types of fluorescent materials may by employed. These three types of fluorescent materials are excited with the ultraviolet light to emit blue light, green light, and red light, respectively, through wavelength conversion. Also in this case, white light can be produced through additive color mixture of blue light, green light, and red light which are formed by exciting the fluorescent materials with the ultraviolet light emitted from the LED chip to convert the wavelength of the ultraviolet light.

Furthermore, various colors of light other than white light can be obtained by employing an appropriate combination of a wavelength conversion material with a particular wavelength of light emitted from an LED chip.

FIG. 6 is a circuit diagram illustrating the electrical connection of the LED chips 1 to 5. The cathode of the LED chip 1 and the cathode of the LED chip 2 in this FIG. are connected to the anode of the LED chip 5, and the anode of the LED chip 3 and the anode of the LED chip 4 are connected to the cathode of the LED chip 5. Furthermore, the anode of the LED chip 1 is connected to the cathode of the LED chip 4 to form an input-output end a, and the anode of the LED chip 2 is connected to the cathode of the LED chip 3 to form an input-output end b.

This connection method is referred to as a bridge connection. When a voltage from an AC power supply such as a commercial power supply is applied between the input-output ends a and b, and if the voltage at the input-output end a is higher than that at the input-output end b, a current flows successively through a path constituted by the input-output end a, the LED chip 1, the LED chip 5, the LED chip 3, and the input-output end b. If the voltage at the input-output end b is higher than that at the input-output end a, a current flows successively through a path constituted by the input-output end b, the LED chip 2, the LED chip 5, the LED chip 4, and the input-output end a.

The waveform of the current flowing through each of the LED chips is shown in FIG. 7. A half-wave rectified current flows through the LED chips 1 to 4, and a full-wave rectified current flows through the LED chip 5. Furthermore, the LED chips 1 to 4 are installed in a generally cross-shaped and opposed arrangement such that the LED chip 5 through which a full-wave rectified current flows is interposed therebetween. Half-wave rectified currents of the same phase flow through the LED chips 1 and 3 opposed to each other with the LED chip 5 interposed therebetween, and also half-wave rectified currents of the same phase flow through the LED chips 2 and 4 opposed to each other with the LED chip 5 interposed therebetween. In addition, half-wave rectified currents having phases shifted by 180° (half the period) flow through respective LED chips installed at a generally right angle (for example, the LED chips 1 and 4, or the LED chips 2 and 3). Therefore, the driving timing of the LED chips 1 and 3 is shifted by half the period with respect to that of the LED chips 2 and 4.

When a voltage from a commercial power supply is applied to a bridge connection circuit having the above configuration, a current flowing through the LED chip 5 is a full-wave rectified current although a half-wave rectified current flows through the LED chips 1 to 4. Therefore, the average current flowing through the LED chip 5 is approximately twice the average current flowing through each of the LED chips 1 to 4. Hence, when the LED chips 1 to 5 have approximately the same area of a principle light emission surface (an active layer), a current allowed to flow is determined by the rated current of the LED chip 5. However, in this case, only about half of the rated current flows through the LED chips 1 to 4, and thus the light emission performance is not effectively utilized.

In view of the above, the current rating of the LED chip 5 can be set to be substantially twice the current rating of each of the LED chips 1 to 4, whereby the current rating of all the LED chips 1 to 5 is effectively utilized. For the purpose of efficiency, the area of the principal light emission surface of the LED chip 5 can be set to substantially 1.5 to substantially 3.0 times the area of each of the LED chips 1 to 4. Moreover, the area of the principal light emission surface of the LED chip 5 can be about 2.0 to about 2.5 times the area of each of the LED chips 1 to 4 under the conditions that the device structure of the LED chip 5 is the same as those of the LED chips 1 to 4.

The ratio of the amount of the light emitted from the LED chip 5 driven by a full-wave rectified current to the total amount of light emitted from the LED illumination device can be set high by increasing the area of the light emission surface (active layer) of this LED chip 5. Therefore, a flicker effect associated with the light emitted from the illumination device can be reduced, and the variations in plane luminance distribution can also be reduced. In particular, the light emitted to the outside through the fluorescent material can exhibit significant color variations with time due to flicker of the light emitted from the LED chips. Therefore, the flicker effect caused by driving the LED chips with the use of a commercial power supply can be reduced by optimizing the installation design and the size of the light emission plane of the LED chips, whereby light having a stable color can be obtained.

Figure 8:
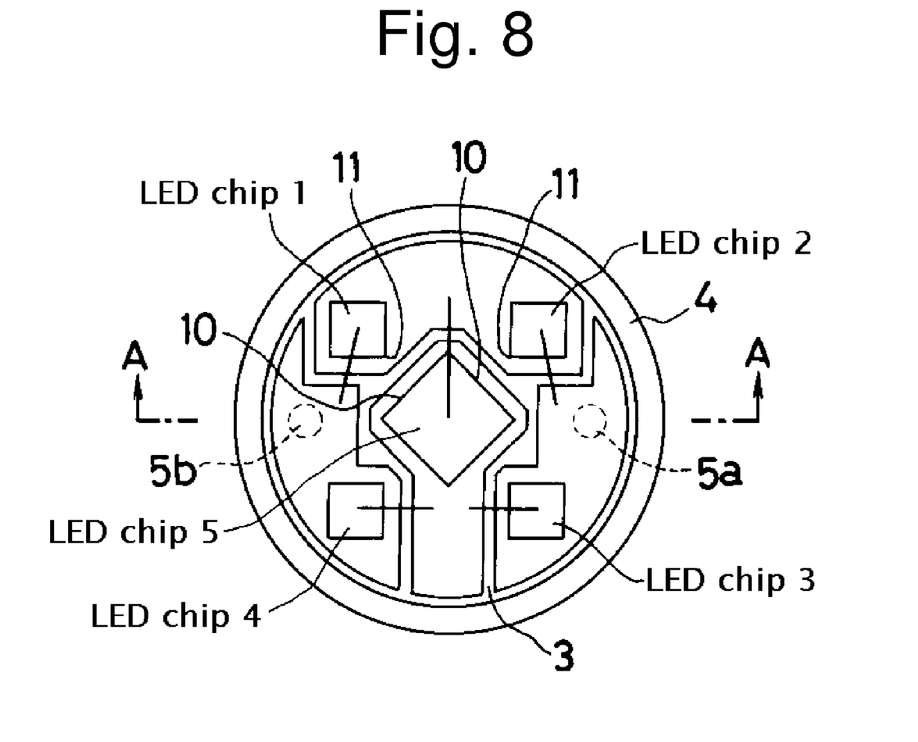
FIG. 8 is a plan view of another example of an LED illumination device made in accordance with principles of the disclosed subject matter.
Figure 9:
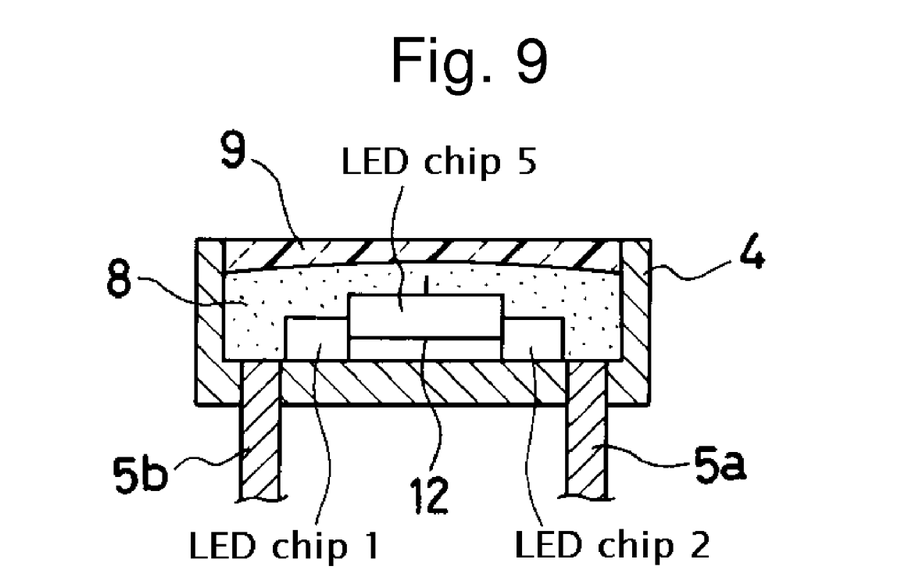
FIG. 9 is a cross-sectional view taken along line A-A in FIG. 8.

FIG. 8 is a plan view of another example of an LED illumination device made in accordance with principles of the disclosed subject matter, and FIG. 9 is a cross-sectional view taken along line A-A of FIG. 8. This example is similar to the previous example, except that the placement direction relation and the placement height relation between the LED chips 1 to 4 and the LED chip 5 are different.

The LED chip 5 is installed close to the LED chips 1 to 4. In this case, the light emitted from one of the LED chips can be absorbed by the other LED chips to reduce light extraction efficiency. This is called as an absorption loss. Therefore, it may be helpful to ensure that the LED chip 5 is separated from the LED chips 1 to 4 by about several hundreds μm to reduce the absorption loss in the installation direction. In addition to this, the LED chips 1 to 4 can be installed such that a side edge (arris) 11 thereof is opposed to a side surface 10 of the LED chip 5, as shown in FIG. 8. Also in this manner, the absorption loss can be reduced.

As for the placement height of the LED chips, a placement surface 12 of the LED chip 5 installed in the central portion can be raised to set the height of the LED chip 5 higher than the heights of the LED chips 1 to 4, as shown in FIG. 9. In this manner, the position of the active layer of the LED chip 5 is set higher than the height of the LED chips 1 to 4, whereby the absorption loss may be reduced. The absorption loss may be greatly reduced through the synergistic effect of the installation direction and the placement height of the LED chips to thereby reduce the ratio of the amount of light not contributing to the emission light of the illumination device to the total amount of light emitted from the LED chips. In this manner, the light extraction efficiency can be improved, thereby realizing a bright LED illumination device.

Figure 10:
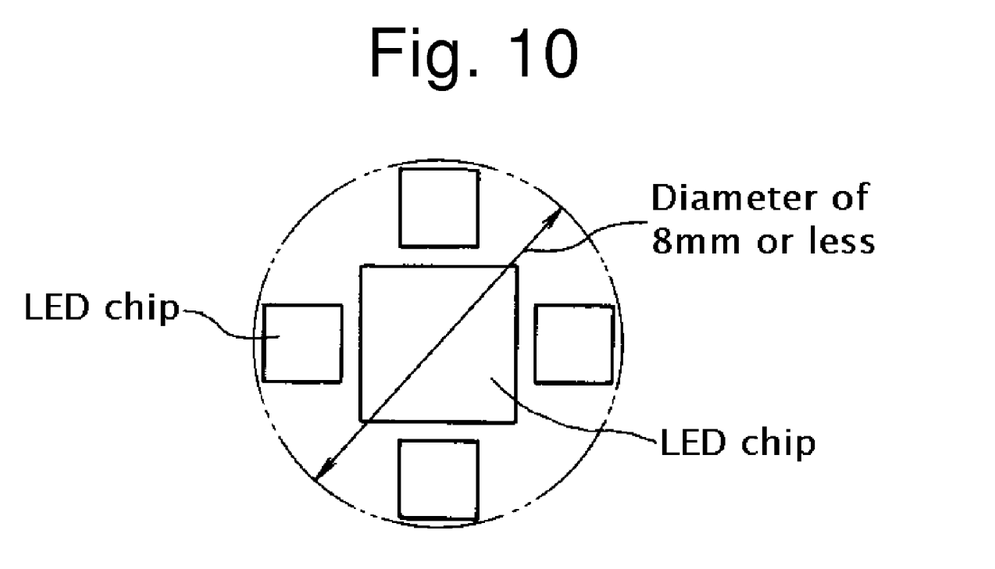
FIG. 10 is a layout diagram for LED chips of an LED illumination device made in accordance with principles of the disclosed subject matter.

The placement range of the LED chips 1 to 5 may be set within a circle having a diameter of approximately 8 mm, as shown in FIG. 10. This setting is made so as to correspond to a limit vision of 1° which is the range in which the light beams emitted from the five LED chips are superposed on each other to intensify the brightness when the illumination device is observed from a distance of 50 cm.

In the above examples, a fluorescent material can be applied so as to cover the LED chips and the bonding wires, and a translucent resin can be filled thereover. However, the LED chips and the bonding wires can also be sealed with a translucent resin. In this case, a fluorescent material may additionally or only be applied to the translucent resin, and alternatively a fluorescent material may not be applied. Still alternatively, such a fluorescent material may be added and dispersed in a translucent resin that is to be filled.

In the LED illumination device that is capable of being driven directly by a commercial power supply as described above, the five LED chips are electrically connected through the bridge connection circuit. In addition to this, the LED chips can be installed such that four LED chips, through which a half-wave rectified current flows, are installed in a generally cross-shaped opposed arrangement with the other LED chip 5, through which a full-wave rectified current flows, interposed therebetween. The half-wave rectified currents can have phases shifted by 180° (half the period) and flow through respective LED chips installed at a generally right angle. The placement range for the five LED chips may be limited, and the LED chips may be sealed with a fluorescent material.

Hence, the LED illumination device is capable of being driven directly by a commercial power supply although the device does not have separate rectification means thereinside. Furthermore, a light flicker effect due to a commercial frequency when the device is turned on can be reduced, and recognizable variations in plane luminance distribution can be reduced. Therefore, an LED illumination device that is excellent in illumination quality and which should be highly marketable can be provided.

While there has been described what are at present considered to be exemplary embodiments of the present invention, it will be understood that various modifications may be made thereto, and it is intended that the appended claims cover such modifications as fall within the true spirit and scope of the present invention.

What is claimed is:

1. An LED white light illumination device, capable of being driven directly by an AC power supply without rectification means, the device comprising:

a package including a conductor pattern and two leads;

an LED chip group including a first LED chip, a second LED chip, a third LED chip and a fourth LED chip, installed on the package, the first to fourth LED chips being connected by a bridge connection circuit having an input and an output, the first to fourth LED chips having the same color of light emitted therefrom;

a fifth LED chip installed on the package and connected to the output of the bridge connection circuit, the fifth LED chip having the same color of light as the light of the first to fourth LED chips, ranging from blue light to ultraviolet light, wherein the first to fourth LED chips connected in the bridge connection circuit are divided into two LED chip pairs that are supplied with respective currents of the same phase and installed in a generally cross-shaped opposed arrangement with the fifth LED chip interposed therebetween, and at least one type of a wavelength conversion material is located adjacent all of the first to fifth LED chips, wherein each of the first to fifth LED chips has an active layer, and a total area of the active layer of the fifth LED chip is larger than a total area of the active layer of at least one of the first to fourth LED chips by a multiple of substantially 2 to substantially 2.5.

2. The LED white light illumination device according to claim 1, wherein the first to fourth LED chips are configured such that a side edge of each of the LED chips is opposed to a corresponding side surface of the fifth LED chip.

3. The LED white light illumination device according to claim 1, wherein a height of a placement surface of the fifth LED chip relative to the package is different from a height of a placement surface of each of the first to fourth LED chips relative to the package.

4. The LED white light illumination device according to claim 2, wherein a height of a placement surface of the fifth LED chip relative to the package is different from a height of a placement surface of each of the first to fourth LED chips relative to the package.

* * * * *